United States Patent [19]

Biter et al.

[11] Patent Number: 4,686,323
[45] Date of Patent: Aug. 11, 1987

[54] MULTIPLE CELL, TWO TERMINAL PHOTOVOLTAIC DEVICE EMPLOYING CONDUCTIVELY ADHERED CELLS

[75] Inventors: William J. Biter, Hudson; Gerald P. Ceasar, Chagrin Falls, both of Ohio

[73] Assignee: The Standard Oil Company, Cleveland, Ohio

[21] Appl. No.: 879,883

[22] Filed: Jun. 30, 1986

[51] Int. Cl.[4] ................. H01L 31/06; H01L 31/18
[52] U.S. Cl. ................. 136/249; 204/2.1; 204/86; 204/92; 427/255.2; 427/39; 427/74; 437/2
[58] Field of Search ............. 29/572; 427/39, 74, 427/76, 86, 87, 255.2; 204/2.1, 86, 92; 136/249 TJ

[56] References Cited

U.S. PATENT DOCUMENTS

| | | | |
|---|---|---|---|
| 4,272,641 | 6/1981 | Hanak | 136/249 |
| 4,316,049 | 2/1982 | Hanak | 136/244 |
| 4,377,723 | 3/1983 | Dalal | 136/249 |
| 4,479,028 | 10/1984 | Sato et al. | 136/249 |
| 4,536,607 | 8/1985 | Wiesmann | 136/249 |
| 4,638,111 | 1/1987 | Gay | 136/249 |

OTHER PUBLICATIONS

J. C. C. Fan et al., *Conference Record, 16th IEEE Photovoltaic Specialists Conf.*, (1982), pp. 692–701, published Jan. 1983.
J. C. C. Fan et al., *Conference Record, 17th IEEE Photovoltaic Specialists Conf.*, (1984), pp. 31–35.
R. B. Siegel, *Conference Record, 18th IEEE Photovoltaic Specialists Conf.*, (1985), pp. 127–133.

Primary Examiner—Aaron Weisstuch
Attorney, Agent, or Firm—Joseph G. Curatolo; Larry W. Evans

[57] ABSTRACT

A two terminal, multiple cell photovoltaic device, each including materials having mutually imcompatible preparatory processes, is manufactured by separately forming the cells on substrates and adhering the cells with a light-transmissive, electrically conductive adhesive. Highly efficient photovoltaic devices including electrodeposited cells of cadmium sulfide and cadmium telluride can be combined with evaporated and condensed cells of cadmium sulfide and copper indium diselenide can be manufactured according to the invention.

36 Claims, 3 Drawing Figures

MULTIPLE CELL, TWO TERMINAL PHOTOVOLTAIC DEVICE EMPLOYING CONDUCTIVELY ADHERED CELLS

BACKGROUND

Multiple cell photovoltaic semiconductor devices are well known. Single crystal devices of this sort were described by E. D. Jackson in the Transactions of the Conference on the Use of Solar Energy in Tucson, Ariz. in 1955. Typically the multiple cell devices use two or more solar cells electrically and optically connected in series. Solar radiation or other light energy enters the first cell. There, a spectral portion of the light is absorbed and electrical power is generated in response to the absorption. The unabsorbed light that passes through the first cell reaches the next cell in the device where another portion of the light spectrum is absorbed. The process is repeated through each of the cells in the device. Each of the cells must have a different absorption characteristic, i.e. optical band gap, in order to achieve the goal of absorption of different spectral components in each of the cells. This goal can be accomplished by using different semiconductor materials in different cells, by adjusting the bandgaps in different cells by adding a bandgap adjusting material to certain cells, or by other means.

The known multiple cell structures have two or more electrical terminals. In the two terminal device, the current generated by the light absorption flows through each of the series-connected cells and is therefore constrained to be the same. To maximize device efficiency, each cell must generate the same current (the photogenerated voltages add), a goal that is achieved by properly selecting the relative optical bandgaps of the different cells and/or the thicknesses of the cells thereby affecting the relatively quantities of absorbed and transmitted light in each cell. Two terminal devices require a non-blocking junction be disposed between each of the cells in the device. By contrast, devices having more than two terminals, have blocking (i.e. non-ohmic or electrically insulating) junctions between the cells. These devices, which are not further dealt with here, have a pair of electrical terminals connected to each cell in the device.

Examples of multiple cell devices of the type just described and employing thin films are disclosed in the following U.S. patents. U.S. Pat. Nos. 4,272,641 and 4,316,049 to Hanak disclose amorphous silicon devices employing two cells separated by a cermet. The cermets are thin sputtered layers, e.g., of metal silicides, that are optically transmissive and electrically conducting. U.S. Pat. No. 4,377,723 to Dalal discloses two cell devices, each cell of which comprises three layers of amorphous silicon, the then outer layers being oppositely doped and spanning a relatively thick non-doped layer. The cells are disposed either directly in contact so that a tunnel junction is formed between them or the cells are separated by a solid, electrically conductive layer transmissive to light that is not absorbed in the cell through which light first passes. The intervening solid layer is preferably amorphous silicon. The bandgap of the lower cell, i.e. the second one the incident light enters, is narrowed by the inclusion of germanium in the amorphous silicon. U.S. Pat. No. 4,479,028 to Sato et al. discloses a three cell device formed from amorphous and microcrystalline silicon. Different spectral absorption properties for the cells are achieved by varying the thicknesses of the layers and cells, adding germanium to the lowest cell and using microcrystalline silicon or adding carbon in the shallowest cell. U.S. Pat. No. 4,536,607 to Wiesmann discloses a two cell device having one cell formed of three layers of an amorphous material and a second cell formed of a two layer polycrystalline semiconductor heterojunction. The two cells are separated by a layer of an electrically conducting, transparent oxide, a cermet, or a very thin layer of a metal. The patent to Wiesmann proposes sequential deposition of the layers in the structure including the layer separating the cells.

Multiple cell, thin film devices show the greatest promise for achieving high efficiency photovoltaic performance. Of those devices, the most promising are those containing different materials (e.g. a polycrystalline II-VI material in one cell and an amorphous or ternary polycrystalline material in another cell), because the optical bandgap selection opportunities are greater when a wider variety of materials is available for use. The limitation on selection of various materials for use in multiple cell devices is the compatibility or lack of compatibility of preparation techniques for the different materials chosen. That is, many combinations of cells, each made of different materials have been proposed, but no one has been able to construct many of these devices because the condition for preparing one of the necessary materials in the device may destroy the usefulness of another. For example, thin film multiple cell structures have been traditionally manufactured by sequentially depositing layer upon layer. But that sequential deposition process cannot be used when the depostion of a subsequent layer spoils previously deposited layers because of the temperature, ambient, or reactants used. This limitation has restricted the actual construction of many preferred, high efficiency multiple cell devices that have been proposed, including some of the devices described by Wiesmann in U.S. Pat. No. 4,536,607.

SUMMARY OF THE INVENTION

In the invention the limitation of process preparation compatibility on selection of materials for use in a thin film, multiple cell photovoltaic device is eliminated. According to the invention, cells of different materials are separately deposited on appropriate substrates. Each separate deposition process may produce one or more cells for the final device. After the separate deposition processes are completed, the deposited cells are united into a single multiple cell device by a light-transmissive, electrically conductive adhesive. Such adhesives may be epoxies containing particles of an electrically conducting solid such as tin oxide, indium tin oxide, cadmium sulfide, cadmium telluride, and zinc telluride. At least one of these adhesives is presently commercially available. The use of the adhesive permits the construction of multiple devices from materials that have incompatible preparative processes such as electrodeposition (including conductivity modifying heat treatment), glow discharge, and vacuum deposition. According to the invention, highly efficient, two terminal multiple cell devices incorporating: (i) amorphous silicon and cadmium sulfide/ copper indium diselenide cells; (ii) amorphous silicon and cadmium sulfide/cadmium telluride (with or without added mercury) cells; (iii) cadmium sulfide/copper indium diselenide and cadmium sulfide/cadmium telluride (with or without added mercury) cells; (iv) cadmium sulfide/cadmium telluride (with and without added mercury) and zinc cadmium telluride/cadmium sulfide cells; and other cells can be simply and reliably manufactured. Because the devices employ only two terminals, instead of four or more, the amount of cutting of electrical interconnect patterns in contacting layers is reduced, making the novel devices relatively inexpensive as well as highly efficient.

The invention may be understood more clearly from the following detailed description taken in conjunction with the drawing figures.

DETAILED DESCRIPTION OF PREFERRED EMBODIMENTS

Figure 1A:
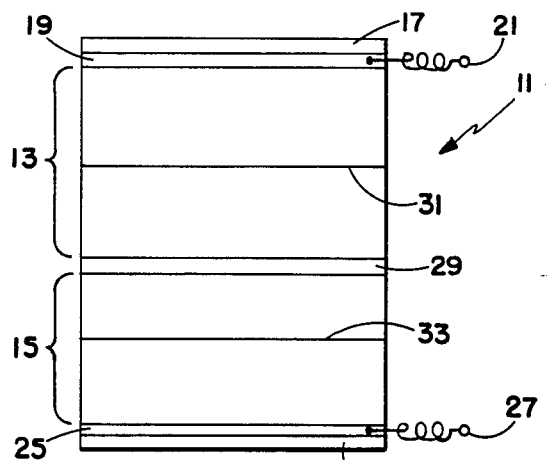
FIGS. 1A and 1B are schematic cross sectional side views of two cell devices in accordance in the invention.

In FIG. 1A, a two cell photovoltaic device 11 according to the invention is shown schematically in cross section. The figures are merely illustrative of various device embodiments and dimensions shown, particularly layer thicknesses, are not to scale. Device 11 includes a first cell 13 and a second cell 15 in electrical and optical series connection. Cell 13 is bounded on one side by a transparent substrate 17, such as glass, through which incident light first enters the device. Disposed between substrate 17 and cell 13 is a light-transmissive, electrically conducting layer 19 to which an electrical terminal 21 is attached.

Cell 15 has a structure similar to that of cell 13. Cell 15 has a substrate 23 disposed at one of its boundaries with an electrically conducting layer 25 disposed between the cell and substrate. An electrical terminal 27 is attached to layer 25 to form the second terminal, which with terminal 21, is used to extract electrical energy from device 11. Substrate 23 need not be electrically conducting nor light-transmissive. In fact, substrate 23 may be reflective and have a specular or textured surface for reflecting unabsorbed light back into the device for a second transmission during which additional light may be absorbed to produce additional electrical energy. Substrate 23 may be a rigid or flexible metal sheet, glass or a plastic or polymer sheet, any of which may have a reflective coating.

Cells 13 and 15 are joined by a layer 29 that is electrically conductive so that the photovoltaic current can flow between terminals 21 and 27. Layer 29 is also light-transmissive so that light that has passed through cell 13 without being absorbed there is transmitted to cell 15 without significant loss.

Cells 13 and 15 preferably have different spectral absorption characteristics. That is, the two cells absorb different spectral ranges of the incident light so as to make maximum use of the available light energy in converting it to electrical energy. In this invention, it is preferred that the difference in spectral response be achieved by using different materials, or materials of the same constituents but in different relative quantities, in each of the cells. That is, for example, cell 13 may respond to the higher energy portion of the light, i.e. may be what is commonly referred to as a blue cell, whereas cell 15 may respond to the lower energy portion of the light, i.e. may be what is commonly referred to as a red cell. As is commonly understood in the art, the cells have a narrower optical bandgap, i.e. a lower energy to which they are responsive, deeper into the device measured in the direction of incident light travel.

Each of the cells in the preferred embodiments of the invention includes at least one semiconductor junction as indicated by line 31 in cell 13 and line 33 in cell 15. A preferred cell comprises a layer of cadmium sulfide having a heterojunction with a layer of cadmium telluride. Such cells can readily be formed on a substrate, such as substrates 17 and 23, that are coated with an electrically conducting layer, such as layers 19 and 25, by electrodeposition. The cadmium sulfide is preferably n-type and the cadmium telluride layer can be converted to p-type by a heat treatment at 250° C. to 500° C., preferably at about 350° C., to form a n-p heterojunction. The electrodeposition process is more fully described in U.S. Pat. No. 4,400,244 to Kroger et al. and the heat treatment process is described in U.S. Pat. No. 4,388,483 to Basol et al. The disclosures of those patents are incorporated herein by reference. The heterojunction cell just described has a strong spectral response at wavelengths from about 400 nm to about 800 nm, i.e. is a blue cell. A candidate cell that provides response above about 800 nm, i.e. a red cell, is a cadmium sulfide/copper indium diselenide cell. Such cells may be manufactured by a vacuum evaporation and condensation process in which the copper indium diselenide is first deposited at 350° C. to 500° C. followed by deposition of the cadmium sulfide layer at 150° C. to 200° C. The substrate, which may be a flexible or rigid metal or high temperature plastic, may be coated with an electrically conducting layer before the vacuum depositions. These processes are more fully described in U.S. Pat. No. 4,335,266, to Mickelsen et al., the disclosure of which is incorporated therein by reference.

As the foregoing description should make clear, it is not possible to deposit the copper indium diselenide cell on an electrodeposited cell because of the relatively high temperatures involved. Likewise, it is not feasible to electrodeposit the cadmium telluride cell on the copper indium diselenide cell because of the chemicals involved in the electroplating step. Therefore, this two cell, highly efficient device cannot be prepared by sequentially depositing each of its layers.

The device just described can be realized according to the invention. In the invention, cells 13 and 15 are deposited by any of the conventional methods known, including those previously described, i.e. electrodeposition and vacuum evaporation and condensation. After the cells are separately deposited (and a "cell" as used here could include one or more junctions or sets of junctions), they are united into a multiple cell device by applying a light-transmissive, electrically conductive adhesive to them and adhering the cells together. The adhesive need not be transparent, but only transmissive without significant loss of light that has passed once through cell 13. The adhesive must be electrically conducting to connect cells 13 and 15 electrically and to form non-blocking, low resistance junctions with each of cells 13 and 15. The adhesive chosen may form tunnel junctions or other low loss contacts with the cells. An appropriate adhesive is an epoxy containing electrically conducting particles, such as particles of tin oxide, indium tin oxide, cadmium sulfide, cadmium telluride, and zinc telluride. At least one such adhesive containing indium tin oxide in a light-transmissive epoxy matrix is commercially available from Amicon Corporation of Lexington, Mass.

Figure 1B:
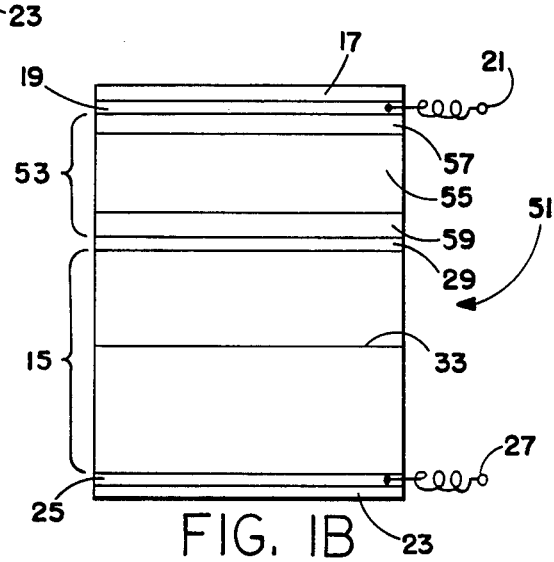

The invention is not limited to a two cell device nor to a cadmium telluride/copper indium diselenide device. In FIG. 1B, a two cell device 51 is shown in schematic cross section. Elements identical to those of FIG. 1A are given the same reference numbers and therefore do not need further explanation. Device 51 contains a first cell 53 in electrical and optical series connection with cell 15. Cell 53 of device 51 is preferably made of amorphous and/or microcrystalline silicon. Cell 53 includes a relatively thick intrinsic type layer 55 disposed between relatively thin oppositely doped layers 57 and 59. One of layers 57 and 59 is doped p-type and the other is doped n-type to form a p-i-n or n-i-p cell. Such amorphous silicon cells are well known in the art and can be deposited on glass or metal substrates at 200° C. to 300° C. in a glow discharge deposition process. These known deposition processes and cells are described in U.S. Pat. No. 4,064,521 to Carlson et al., the disclosure of which is incorporated herein by reference.

While the lower deposition temperatures and process techniques of glow discharge are not entirely incompatible with vacuum deposition processes, it is not desirable to construct, by sequential deposition of layers, an amorphous/microcrystalline silicon cell on a cadmium sulfide/copper indium diselenide cell. Such a cell cannot be constructed sequentially by depositing the silicon cell first, because the amorphous silicon would be seriously degraded by the evolution of hydrogen at the copper indium diselenide deposition and heat treatment temperatures, ruining the structure. Likewise, it is not desirable to place a cadmium sulfide/copper indium diselenide cell in apparatus for depositing amorphous silicon because of the potential for contamination. The invention provides the solution and permits the manufacture of the cell. As before, the copper indium diselenide/cadmium sulfide cell is separately deposited, most likely by vacuum evaporation and condensation. The amorphous/microcrystalline silicon cell is separately deposited by a glow discharge process and these two cells are adhered together with a light-transmissive, electrically conductive adhesive, as described above. Because of the wider bandgap of amorphous silicon compared to cadmium telluride, this embodiment allows more of the incoming light to reach cell 15 than the embodiment described with respect to FIG. 1A. Thus there is some sacrifice in the blue response in this embodiment and some gain in red response. These changes in spectral response may be altered to some degree by selecting the relative thicknesses of the layers in the cell carefully.

Other complete devices and combinations of cells can be constructed with this disclosure of the invention. For example, a combination of an amorphous silicon cell with a cadmium sulfide/cadmium telluride cell may be made, although at the expense of red response compared to the preferred device which is the first one described in this specification. The optical bandgap of each of the cadmium sulfide/cadmium telluride cells can be lowered, if desired, by including some mercury in the cadmium telluride to form mercury cadmium telluride. The change would be particularly desirable in the cell just described since the red response of the deeper cell, the cadmium-based cell would be improved by narrowing of the bandgap. Mercury cadmium telluride may be electrodeposited, just as cadmium telluride is electrodeposited, but with the addition of mercury ions to the electrolyte. See U.S. Pat. No. 4,548,681 to Basol et al., the disclosure of which is incorporated herein by reference.

Figure 2:
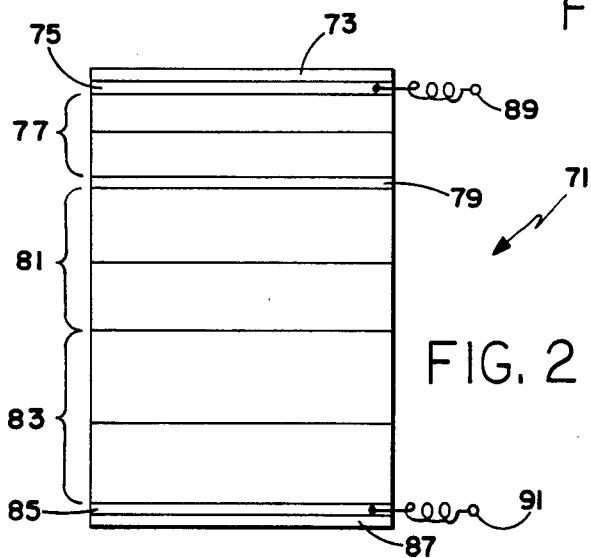
FIG. 2 is a schematic cross sectional side view of a three cell device in accordance with the invention.

A three cell photovoltaic device 71 according to the invention is shown in schematic cross section in FIG. 2. The structure shown includes a light-transmissive substrate 73, such as glass, and a light-transmissive layer 75, such as indium tin oxide, disposed on substrate 73. Next, a first photovoltaic cell 77 containing a single junction is disposed on layer 75 and the other side of cell 77 contacts a light-transmissive, electrically conducting adhering layer 79. Layer 79 is the same as the conductive light-transmissive adhering layer already described for other embodiments. Layer 79 bonds cell 77 to cells 81 and 83 each of which contains a single junction. Cell 83, the furthest cell in the device with respect to the direction of travel of incident light, is disposed on an electrically conductive layer 85 which in turn is disposed on a substrate 87. As before, substrate 87 need not be light-transmissive and, most preferably, is reflective so that unabsorbed light is reflected back into cell 83. Electrical terminals 89 and 91 contact layers 75 and 85, respectively, for extracting light-generated electrical energy from the cell. If substrate 87 is an electrical conductor that makes a good contact to cell 83, then layer 85 may be an integral part of substrate 87.

To achieve maximum utilization of the light energy falling on device 71, the effective optical bandgaps of cells 77, 81, and 83 successively decrease. Cells 81 and 83 may be electrodeposited layers of cadmium sulfide/cadmium telluride and cadmium sulfide/mercury cadmium telluride, respectively. The electrodeposition processes already described for these materials are compatible with each other so that the four layers may be successively deposited. Cell 77 may also be electrodeposited as layers of cadmium sulfide and zinc cadmium telluride. Zinc cadmium telluride may be electrodeposited from a cadmium telluride plating bath to which zinc ions have been added. The presence of zinc in the deposited layer increases the optical bandgap, unlike the presence of mercury which decreases the optical bandgap. It is not desirable to immerse the cadmium telluride and mercury cadmium telluride cells in a plating solution containing zinc ions because the electrolyte may dissolve some of the previously deposited material or contaminate its surfaces. Moreover, the zinc containing material may require a heat treatment step that the cadmium telluride and mercury cadmium telluride layers cannot tolerate. However, by using the novel adhered structure, the desired three cell device can be manufactured.

Additional multiple cell devices containing various numbers of cells can be manufactured according to the inventive process. In each of these devices, the invention permits construction of a two terminal device resulting in considerable savings. While the figures show only a single device, in most applications a number of devices having series and/or parallel interconnections would be used to obtain a desired, preselected output voltage and current. As is known in the art, these interconnections would be achieved, in part, by forming appropriate patterns in the electrically conductive layers disposed adjacent the substrates on opposite sides of the device, before the semiconductors are deposited. The patterning is accomplished by photolithography, laser scribing or the like. This process is a relatively large component of the total cost of manufacturing. Absent the present invention, a two cell structure of the type described, i.e. with two cells having incompatible preparative processes, can at best be manufactured as a four terminal device. That four terminal device has two terminals per cell, each of which contacts a patterned layer, meaning that four layers are patterned, as compared to two in the invention. Therefore, the invention substantially reduces the manufacturing cost of the multiple cell devices of the type described. Further cost gains are achieved in novel two terminal devices containing three or more cells.

The invention has been described with reference to certain preferred embodiments. Various modifications and additions within the spirit of the invention will occur to those of skill in the art. Accordingly the scope of the invention is limited solely by the following claims.

We claim:

1. A method of manufacturing a multiple cell, two terminal, photovoltaic device comprising depositing on a first, light-transmissive substrate, a first photovoltaic cell of thin film semiconductor material for absorbing light having energies exceeding a first energy, depositing on a second substrate a second photovoltaic cell of thin film semiconductor material for absorbing light having energies exceeding a second energy, said second energy being smaller than said first energy, bonding said cells together opposite said first and second substrates with an electrically conductive, light-transmissive adhesive and establishing a first electrical contact to said first cell adjacent to said first substrate as a first terminal of said device and establishing a second electrical contact to said second cell adjacent said second substrate to form a second electrical terminal of said device.

2. The method of claim 1 including electrodepositing at least part of one of said first and second cells.

3. The method of claim 2 including electrodepositing a layer of cadmium telluride and electrodepositing a layer of cadmium sulfide in contact with said layer of cadmium telluride as one of said first and second cells.

4. The method of claim 2 including electrodepositing a layer of mercury cadmium telluride and electrodepositing a layer of cadmium sulfide in contact with said layer of mercury cadmium telluride as one of said first and second cells.

5. The method of claim 4 wherein said electrodeposited layers of cadmium sulfide and mercury cadmium telluride form said second cell and including electrodepositing a layer of zinc cadmium telluride and electrodepositing a layer of cadmium sulfide in contact with said layer of zinc cadmium telluride as said first cell.

6. The method of claim 3 wherein said electrodeposited layers of cadmium sulfide and cadmium telluride form said second cell and including electrodepositing a layer of zinc cadmium telluride and electrodepositing a layer of cadmium sulfide in contact with said layer of zinc cadmium telluride as said first cell.

7. The method of claim 1 including depositing at least part of one of said first and second cells by evaporation and condensation.

8. The method of claim 7 including condensing a layer of copper indium diselenide as part of one of said first and second cells.

9. The method of claim 7 including condensing a layer of cadmium sulfide as part of one of said first and second cells.

10. The method of claim 1 including depositing at least part of one of said first and second cells in a glow discharge.

11. The method of claim 10 including depositing a layer of amorphous silicon in a glow discharge as part of one of said first and second cells.

12. The method of claim 1 including bonding said cells together with a light-transmissive epoxy adhesive containing light-transmissive, electrically conducting particles.

13. The method of claim 12 wherein said particles are selected from tin oxide, indium tin oxide, cadmium sulfide, cadmium telluride, and zinc telluride.

14. The method of claim 1 wherein said first substrate is glass.

15. The method of claim 14 including depositing an electrically conducting, light-transmissive layer on said glass substrate, before depositing said first cell, for forming said first terminal.

16. The method of claim 1 wherein said second substrate is a metal and forms said second terminal.

17. The method of claim 1, wherein said second substrate is an electrical insulator, including depositing an electrically conducting layer on said second susbstrate for forming said second terminal, before depositing said second cell.

18. The method of claim 1 including electrodepositing layers of cadmium sulfide and cadmium telluride as said first cell and condensing layers of cadmium sulfide and copper indium diselenide as said second cell.

19. The method of claim 1 including electrodepositing layers of cadmium sulfide and mercury cadmium telluride as said first cell and condensing layers of cadmium sulfide and copper indium diselenide as said second cell.

20. The method of claim 1 including sequentially depositing first doped, intrinsic, and second doped layers of amorphous silicon in a glow discharge as said first cell, said first doped layer being of an opposite conductivity type from said second doped layer.

21. The method of claim 20 including condensing layers of cadmium sulfide and copper indium diselenide as said second cell.

22. A multiple call, two terminal photovoltaic device comprising a first photovoltaic cell formed of a thin film non-monocrystalline semiconductor material disposed on a first light-transmissive substrate and having a first electrical terminal connected to said first cell adjacent said first substrate, said first cell absorbing light having energies exceeding a first energy, a second photovoltaic cell formed of a thin film polycrystalline, semiconductor material, disposed on a second substrate and having a second electrical terminal connected to said second cell adjacent said second substrate, said second cell absorbing light having energies exceeding a second energy, said second energy being smaller than said first energy, said first and second cells being bonded together opposite said first and second substrates by an electrically conductive, light-transmissive adhesive.

23. The device of claim 22 wherein said first cell includes a layer of cadmium sulfide and a layer of cadmium telluride disposed on said layer of cadmium sulfide.

24. The device of claim 23 wherein said second cell includes a layer of cadmium sulfide and a layer of copper indium diselenide disposed on said layer of cadmium sulfide.

25. The device of claim 22 wherein said first cell includes a layer of cadmium sulfide and a layer of mercury cadmium telluride disposed on said layer of cadmium sulfide.

26. The device of claim 25 wherein said second cell includes a layer of cadmium sulfide and a layer of copper indium diselenide disposed on said layer of cadmium sulfide.

27. The device of claim 22 wherein said second cell includes a layer of cadmium sulfide and a layer of copper indium diselenide disposed on said layer of cadmium sulfide.

28. The device of claim 22 wherein said first cell includes a first doped layer, an undoped layer, and a second doped layer of amorphous silicon, said first doped layer being of an opposite conductivity type from said second doped layer.

29. The device of claim 28 wherein said second cell includes a layer of cadmium sulfide and a layer of copper indium diselenide disposed on said layer of cadmium sulfide.

30. The device of claim 22 wherein one of said first and second cells includes a layer of zinc cadmium telluride.

31. The device of claim 22 wherein said light-transmissive, electrically conductive adhesive includes electrically conductive particles disposed in an epoxy matrix.

32. The device of claim 31 wherein said electrically conducting particles are chosen from one of tin oxide, indium tin oxide, cadmium sulfide, cadmium telluride, and zinc telluride.

33. The device of claim 2 wherein said second cell includes a layer of cadmium sulfide and a layer of cadmium telluride disposed on said layer of cadmium sulfide.

34. The device of claim 33 wherein said first cell includes a layer of cadmium sulfide and a layer of zinc cadmium telluride disposed on said layer of cadmium sulfide.

35. The device of claim 22 wherein said second cell includes a layer of cadmium sulfide and a layer of mercury cadmium telluride disposed on said layer of cadmium sulfide.

36. The device of claim 35 wherein said first cell includes a layer of cadmium sulfide and a layer of zinc cadmium telluride disposed on said layer of cadmium sulfide.

* * * * *